(12) United States Patent
Doi

(10) Patent No.: US 7,286,419 B2
(45) Date of Patent: Oct. 23, 2007

(54) SEMICONDUCTOR MEMORY DEVICE OUTPUTTING IDENTIFYING AND ROLL CALL INFORMATION

(75) Inventor: Hitoshi Doi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 93 days.

(21) Appl. No.: 11/200,012

(22) Filed: Aug. 10, 2005

(65) Prior Publication Data
US 2006/0056246 A1    Mar. 16, 2006

(30) Foreign Application Priority Data
Sep. 14, 2004    (JP)    ............................. 2004-266514

(51) Int. Cl.
*G11C 7/00*    (2006.01)
(52) U.S. Cl. ............... 365/200; 365/189.07; 365/225.7
(58) Field of Classification Search ................. 365/200, 365/189.09, 225.7, 189.07, 230.06
See application file for complete search history.

(56) References Cited

U.S. PATENT DOCUMENTS 6,888,751 B2 *    5/2005    Makuta et al. .........    365/185.09

2003/0117847 A1 *    6/2003    Makuta et al. .........    365/185.09
2006/0007763 A1 *    1/2006    Gelencser et al. ..........    365/200

FOREIGN PATENT DOCUMENTS

JP    05-047196    2/1993
JP    11-121566    4/1999

* cited by examiner

*Primary Examiner*—Gene N. Auduong
(74) *Attorney, Agent, or Firm*—Volentine & Whitt, P.L.L.C.

(57) ABSTRACT

A semiconductor memory device has an information storing circuit such as a fuse box as well as a memory cell array with redundant memory cells that can be used to replace defective memory cells. Address information indicating which memory cells have been replaced is stored in the information storing circuit, which also stores information identifying the semiconductor memory device. In one testing mode, the identifying information is output in response to input to a series of address signals that would normally select memory cells in the memory cell array. In another testing mode, roll call results are output indicating whether each input address matches an address stored in the information storing circuit. Use of address signals to elicit output of both identifying and roll call information saves space in the memory device.

15 Claims, 5 Drawing Sheets

SEMICONDUCTOR MEMORY DEVICE OUTPUTTING IDENTIFYING AND ROLL CALL INFORMATION

BACKGROUND OF THE INVENTION

1. Field of the Invention

The present invention relates to a semiconductor memory device that, besides storing data in memory cells, also stores and can output identifying information and repair information.

2. Description of the Related Art

For a variety of purposes, including testing purposes, semiconductor memory manufacturers find it useful to store identifying information in memory devices. In one conventional scheme, the identifying information is stored by blowing selected fuses in a so-called fuse box in the device, and is read out when a clock signal and an enable signal are supplied. Japanese Patent Application Publication No. 11-121566 shows one example of this scheme, implemented using a counter. A different conventional example, also using a counter, will be given in the detailed description of the present invention.

To increase production yields, the memory cell arrays of large-scale memory devices include redundant memory cells that can be used to replace defective memory cells. Repair information identifying the memory cells that have been replaced, needed to direct access to the redundant memory cells that replace them, may also be stored in a fuse box. Japanese Patent Application Publication No. 05-047196 shows one example of this scheme; another example will be given in the detailed description below.

External output of the information identifying replaced memory cells is useful during the testing of memory devices. In a roll call test, for example, a sequence of address signals is supplied to the memory device, which outputs a bit of information indicating whether each addressed memory cell, or group of memory cells, has been replaced. A roll call enable signal is used to enable the output of this information, instead of output of the data stored in the memory cells.

It would be desirable for a memory device to be capable of output of both identifying information and roll call information, but if the conventional schemes outlined above are combined in a straightforward way, the necessary circuitry takes up excessive space. In particular, the two fuse boxes take up considerable space. The counter used for output of identifying information also takes up space.

SUMMARY OF THE INVENTION

An object of the present invention is to provide a semiconductor memory device that can efficiently output both identifying information and repair information.

The invented semiconductor memory device includes a memory cell array with redundant cells, a data bus for output of data stored in the memory cells, and an information storing circuit storing first information indicating which memory cells have been replaced by redundant memory cells and second information identifying the semiconductor memory device. A decision circuit receives an address signal, compares the received address with the stored first information, and outputs a roll call signal, indicating the comparison result, to the data bus. An identifying circuit receives the address signal, reads the second information from the information storing circuit according to the address signal, and outputs the second information to the data bus, preferably one bit at a time in response to different address values.

The information storing circuit is preferably a fuse-programmable circuit with a single fuse box including both fuses that store the first information and fuses that store the second information.

The roll call result signal and the second information may be combined in a logic circuit, sent to the data bus on a single signal line, and output at the same external output pad of the memory device. The logic circuit may also receive a pair of enable signals, one enabling output of the result signal, the other enabling output of the second information, and operate in the high-impedance output state when both enable signals are inactive.

DETAILED DESCRIPTION OF THE INVENTION

Figure 1:
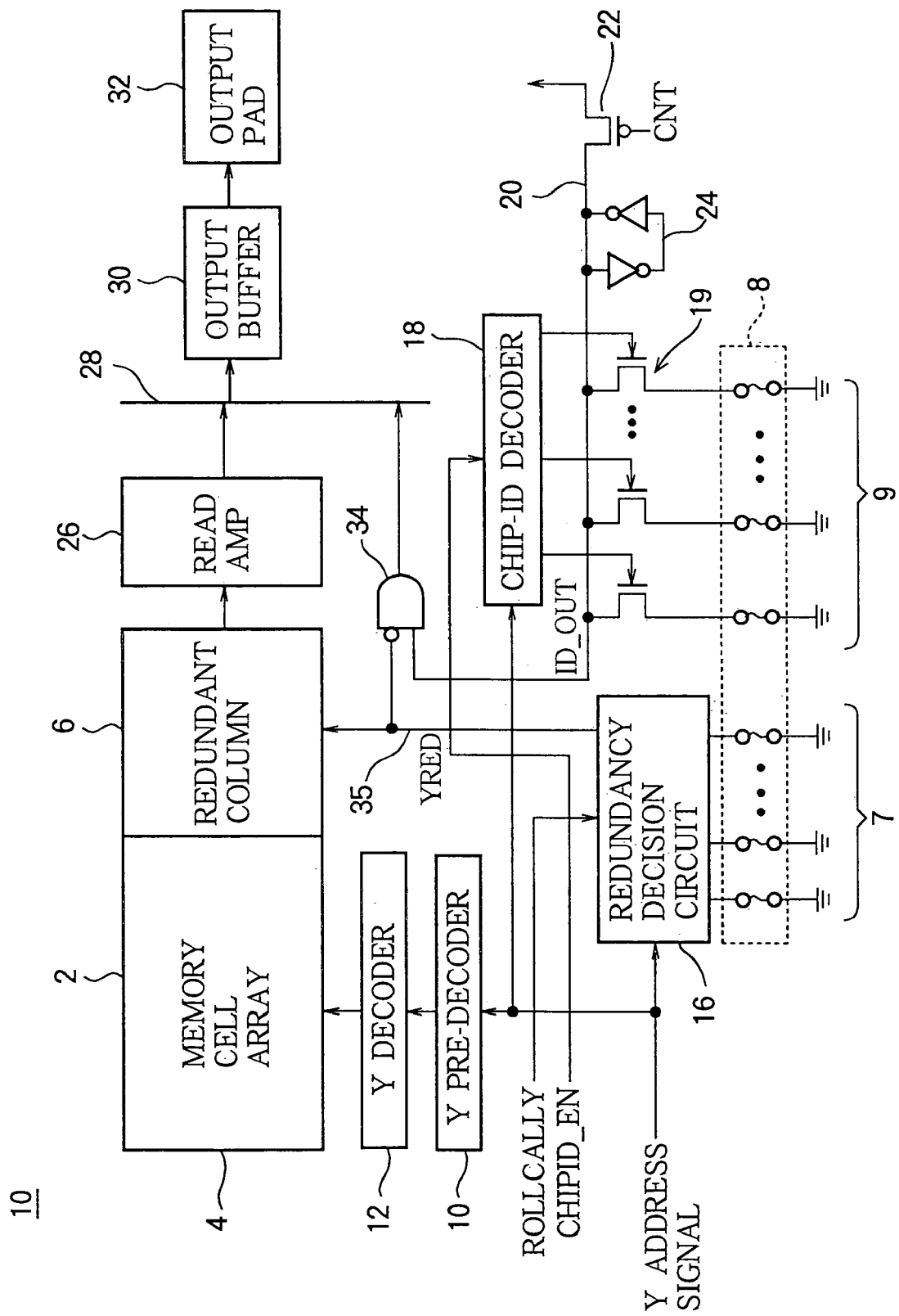
FIG. 1 is a block diagram showing the structure of a first semiconductor memory device embodying the present invention.

Embodiments of the invention will now be described with reference to the attached drawings, in which like elements are indicated by like reference characters.

FIRST EMBODIMENT

Referring to FIG. 1, the first embodiment is a semiconductor memory device including a memory cell array 2 having both a regular row-column array of memory cells 4 and a redundant column of memory cells 6. If a memory cell in the regular row-column array 4 is defective, the entire column of memory cells including the defective cell is replaced by the redundant column 6. Information designating the replaced column is programmed into a first plurality of fuses 7 in a fuse box 8, by blowing selected fuses.

The fuse box 8 also includes a second plurality of fuses 9 that are programmed to store identifying information. Typically, the semiconductor memory device is fabricated as a chip in a semiconductor wafer, and the identifying information includes information identifying the wafer by lot and number and further information identifying the position of the chip on the wafer.

Memory cells are selected by a column (Y) address signal and a row address signal (not shown), each address signal comprising a plurality of bits. The Y address signal is decoded by a Y pre-decoder 10 and a Y decoder 12 and supplied to the regular row-column array 4. The Y address signal is also supplied to a redundancy decision circuit 16 and a chip-ID decoder 18. The redundancy decision circuit 16 compares the Y address with the information stored in the first plurality of fuses 7 in the fuse box 8 and outputs a Y redundancy (YRED) signal that selects the redundant column 6 of memory cells when the Y address signal designates a replaced column. The chip-ID decoder 18 decodes the Y address signal to drive a plurality of n-channel metal-oxide-semiconductor (NMOS) transistors 19 that switchably connect the second plurality of fuses 9 in the fuse box 8 to an ID_OUT signal line 20. One end of the ID_OUT signal line 20 is connected to the drain of a p-channel metal-oxide-semiconductor (PMOS) transistor 22 that has its source connected to the power supply. The gate of the PMOS transistor 22 is driven by a control signal (CNT). A latch 24 comprising, for example, a pair of cross-coupled inverters is also connected to the ID_OUT signal line 20.

The intersection of each row and column in the memory cell array 2 is a set of one or more memory cells referred to as a word. During a normal read operation, the data stored in the addressed word are amplified by a set of one or more read amplifiers (AMP) 26 and placed on a data bus 28. The data bus lines are connected to an output buffer 30, which outputs the data at one or more output pads 32.

One of the data bus 28 lines is also connected to the output terminal of a logic circuit 34. The logic circuit 34 has two input terminals, one connected to the YRED signal line 35, the other connected to the ID_OUT signal line 20. The output of the logic circuit 34 is high when the ID_OUT signal is high and the YRED signal is low, and is low at other times. The data bus line to which the logic circuit 34 is connected is independent of the data bus lines connected to the read amplifiers 26. Alternatively, the data bus line connected to the logic circuit 34 is also connected to one of the read amplifiers 26, but the output transistors of the logic circuit 34 are small enough so that when the read amplifiers 26 are active, their output prevails over the output of the logic circuit 34.

Besides receiving the Y address signal, the redundancy decision circuit 16 receives a roll call enable signal (ROLLCALLY). When the roll call enable signal is active (high), the redundancy decision circuit 16 outputs the Y redundancy signal (YRED) according to the result of the comparison between the Y address and the information stored in the first plurality of fuses 7. When the roll call enable signal is low (inactive) the redundancy decision circuit 16 holds the YRED signal at the low logic level.

The chip-ID decoder 18 receives a chip-ID enable signal (CHIPID_EN) and decodes the Y address signal when this enable signal is active. When the chip-ID enable signal is inactive, all outputs of the chip-ID decoder 18 are low and all of the NMOS transistors 19 are switched off.

When connected to test equipment (not shown), the semiconductor memory device operates in various test modes, including a chip-ID test mode and a roll call test mode.

In the chip-ID test mode, the test equipment holds the roll call signal at the inactive level and the chip-ID enable signal at the active level, and sends a series of Y address signals that, when decoded by the chip-ID decoder 18, turn on the NMOS transistors 19 one by one in sequence. Before each NMOS transistor is turned on, the test equipment briefly activates the control signal (CNT) by driving it low to turn on PMOS transistor 22 and precharge the ID_OUT signal line 20 to the power-supply level. During the chip-ID test, when an NMOS transistor 19 is turned on, if the fuse to which it is connected has been blown, the ID_OUT signal line 20 remains at the power supply level. If the fuse is intact, the ID_OUT signal line 20 is pulled down to the ground level. Since the YRED signal is low, the logic level of the ID_OUT signal line 20 propagates through the logic circuit 34 to the data bus 28, and is output by the output buffer 30 at one of the output pads 32, where it is read by the test equipment. After reading out all necessary bits of identifying information stored in the second plurality of fuses 9, the test equipment can proceed with further tests.

For example, the test equipment can perform various read-write tests on the regular row-column array 4 of memory cells. If a defective memory cell is found in one of these tests, its column address is programmed into the first plurality of fuses 7 in the fuse box 8, so that in subsequent operation the defective column will be replaced by the redundant column 6.

After such a redundancy repair has been performed, a roll call test may be carried out to verify that the address of the defective column has been correctly programmed. In a roll call test, the test equipment holds the roll call enable signal (ROLLCALLY) at the active level and the chip-ID enable signal (CHIPID_EN) at the inactive level, briefly activates the control signal (CNT), and then again sends a series of Y address signals. The series typically includes all Y addresses, from address zero, in which all bits of the Y address signal are '0', to the maximum address, in which all bits are '1'. The redundancy decision circuit 16 compares each Y address with the information programmed into the first plurality of fuses 7 in the fuse box 8, and drives the YRED signal line high when the Y address matches the programmed information, indicating that the address is the column address of the replaced column. Since latch 24 holds the ID_OUT signal line 20 at the high logic level, the logic circuit 34 inverts the YRED signal and outputs the inverted signal to the data bus 28. The output buffer 30 outputs the inverted YRED signal at one of the output pads 32 to be read by the test equipment. The test equipment verifies that this output signal goes low only when the address of the defective column is supplied. The roll call test can also be used before a defective column is replaced, to verify that the fuses have not already been programmed to replace a different column.

During normal operation, the roll call signal is active and the chip-ID enable signal is inactive. The redundancy decision circuit 16 outputs the YRED signal to enable the redundant column 6 of memory cells to be selected in place of a defective column.

SECOND EMBODIMENT

Figure 2:
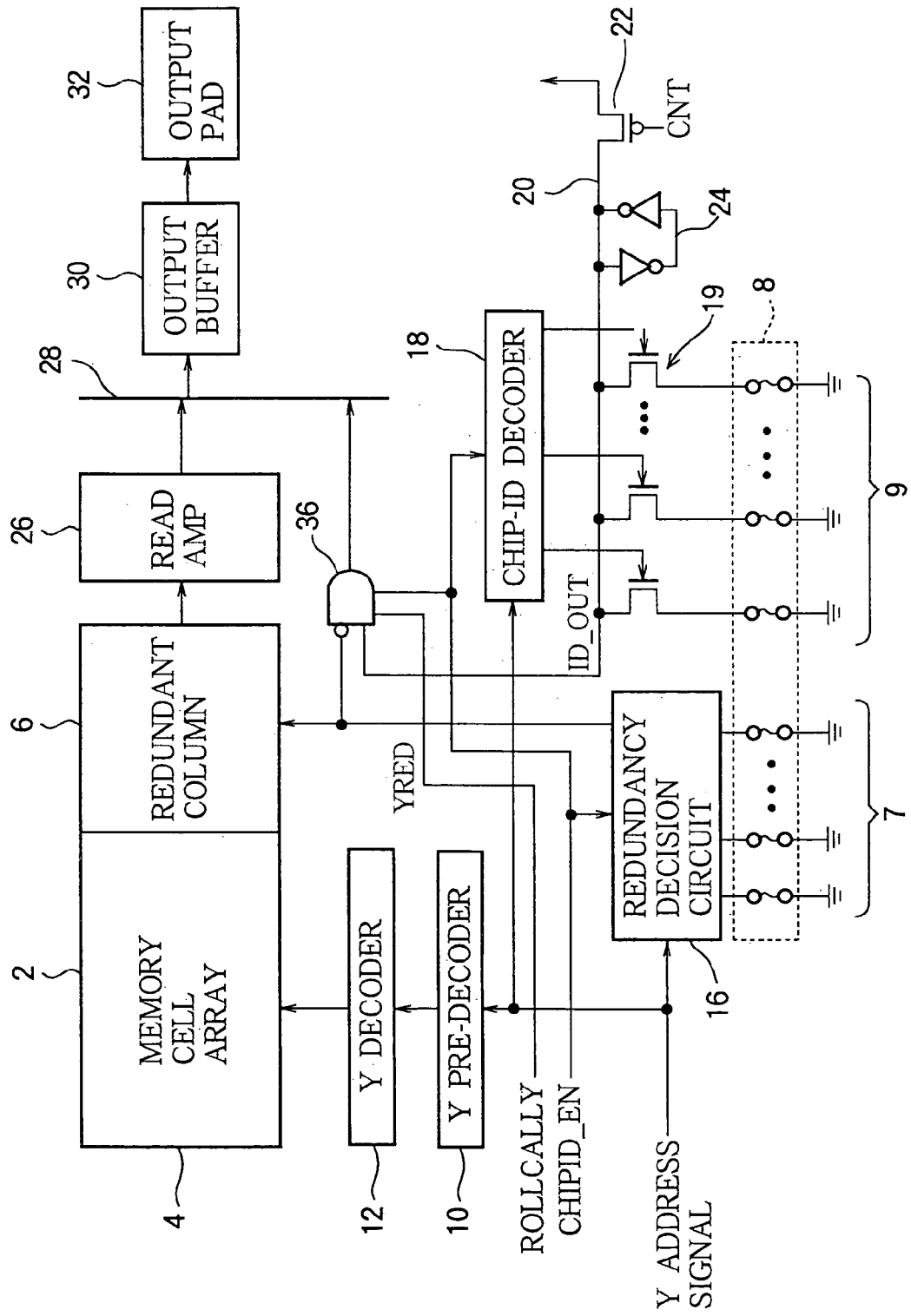
FIG. 2 is a block diagram showing the structure of a second semiconductor memory device embodying the present invention.

Referring to FIG. 2, the second embodiment is identical to the first embodiment except that the redundancy decision circuit 16 receives the chip-ID enable signal (CHIPID_EN) instead of the roll call enable signal (ROLLCALLY), and the logic circuit 36 is a three-state circuit that receives both enable signals (CHIPID_EN and ROLLCALLY) as well as the Y redundancy signal (YRED) and ID_OUT signal. The data bus line connected to the output terminal of the logic circuit 36 is also connected to one of the read amplifiers 26.

Figure 3:
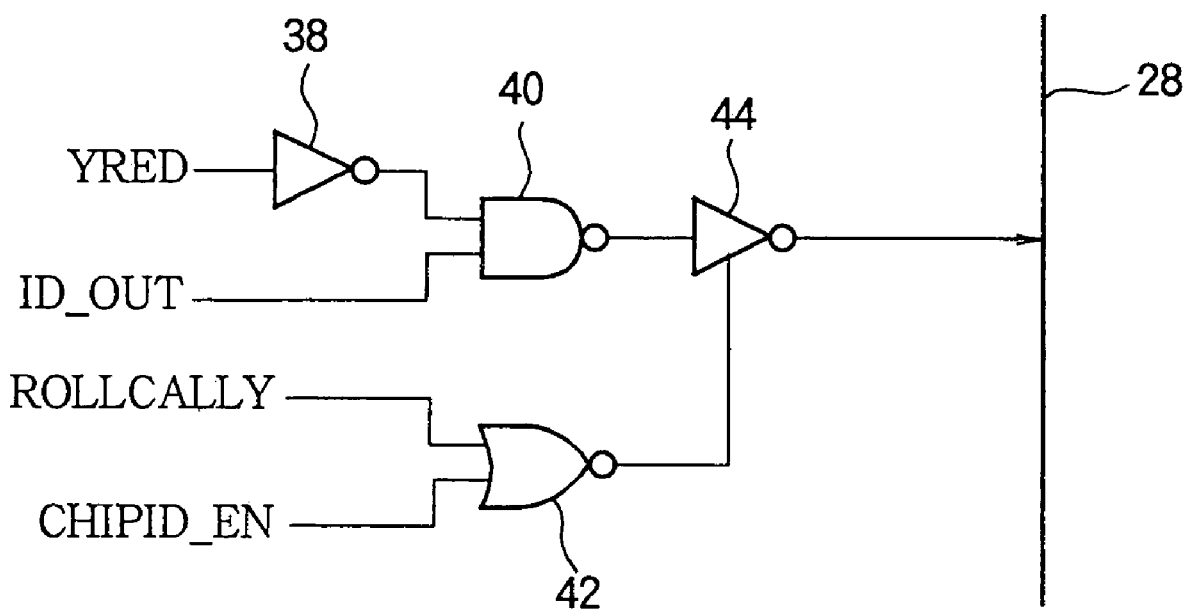
FIG. 3 is an exemplary circuit diagram illustrating the logic circuit in FIG. 2.

There are various possible internal structures for the logic circuit 36. FIG. 3 shows one example, comprising an inverter 38 that inverts the YRED signal, a NAND gate 40 that receives the ID_OUT signal and the inverted YRED signal, a NOR gate 42 that receives the two enable signals (ROLLCALLY and CHIPID_EN), and a three-state inverter 44 that receives the outputs of the NAND gate 40 and NOR gate 42. The NOR gate 42 performs a logical NOR operation on the enable signals (ROLLCALLY and CHIPID_EN). When the output of the NOR gate 42 is high, the output terminal of the three-state inverter 44 is in the high-impedance state. When the output of the NOR gate 42 is low, the three-state inverter 44 inverts the output of the NAND gate 40 and outputs the inverted signal to the data bus 28, the NAND gate 40 and three-state inverter 44 combining to perform a logical AND operation on the ID_OUT signal and the inverted YRED signal.

The redundancy decision circuit 16 holds the YRED signal at the low logic level when the CHIPID_EN signal is active (high), and outputs a comparison result when the CHIPID_EN signal is inactive (low).

During normal operation, both enable signals (CHIPID_EN and ROLLCALLY) are inactive (low), so the output of the NOR gate 42 is high. The output terminal of the logic circuit 36 is therefore in the high-impedance state, and does not interfere with the output of data from the read amplifiers 26.

In the chip-ID test mode, the chip-ID enable signal (CHIPID_EN) is active (high) The chip-ID decoder 18 accordingly decodes the Y address signal while the redundancy decision circuit 16 holds the YRED signal at the low logic level. The output of the chip-ID decoder 18 turns on one of the NMOS transistors 19. The resulting ID_OUT signal propagates through the NAND gate 40 and three-state inverter 44 in FIG. 3 to the data bus 28, and is output by the output buffer 30 at one of the output pads 32. As in the first embodiment, test equipment supplies a series of Y addresses to obtain successive bits of the chip identifying information stored in the second plurality of fuses 9 in the fuse box 8.

In a roll call test, the chip-ID enable signal (CHIPID_EN) is inactive (low) and the roll call enable signal (ROLLCALLY) is active (high). All outputs of the chip-ID decoder 18 are low, so all NMOS transistor 19 are turned off. After the control signal (CNT) has been briefly driven low, the latch 24 holds the ID_OUT signal line 20 at the high logic level while the redundancy decision circuit 16 compares the Y address signal with the information stored in the first plurality of fuses 7 and outputs the comparison result in the YRED signal. The YRED signal propagates through the inverter 38, NAND gate 40, and three-state inverter 44 in FIG. 3 to the data bus 28, and is output (in an inverted state) by the output buffer 30 at one of the output pads 32. Test equipment can perform a roll call by running through all Y addresses to check the information programmed into the first plurality of fuses 7.

One advantage of the first and second embodiments is that both the fuses storing the address of a replaced column of memory cells and the fuses storing chip identifying information are located in the same fuse box 8, so the memory device requires only a single fuse box.

Another advantage is that no counter is required for the output of chip identifying information. Test equipment obtains the identifying information in the same way that it obtains roll call information, by supplying a series of Y addresses.

A related advantage is that that in a test requiring only certain bits of identifying information, the test equipment can obtain those bits selectively by supplying the corresponding Y addresses, without having to read unnecessary identifying bits.

A further advantage is that both the roll call test results and the identifying information are output at the same output pad, so the test equipment can obtain both types of information through a single probe.

Figure 4:
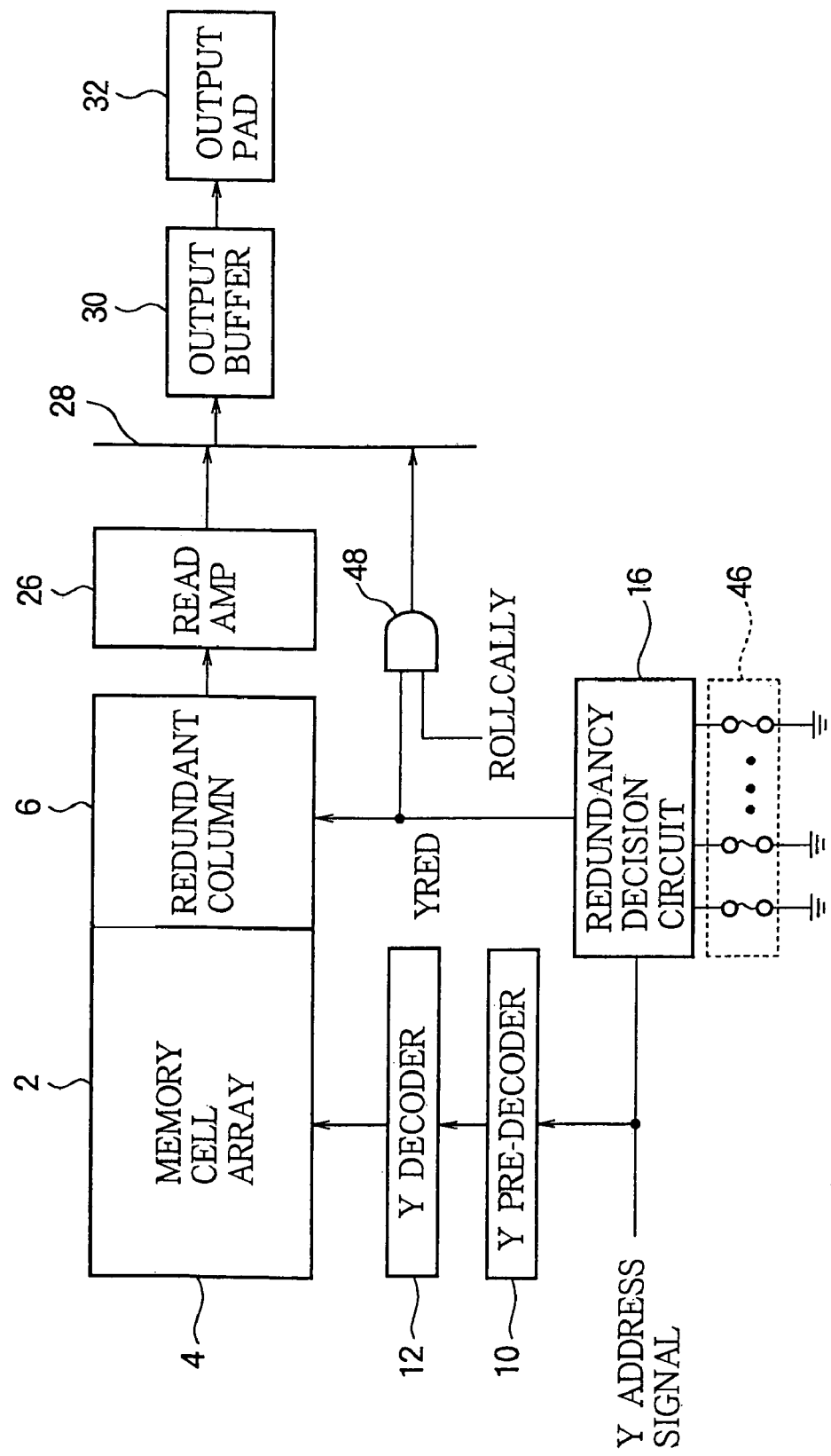
FIG. 4 is a block diagram of a conventional semiconductor memory device providing roll call output.
Figure 5:
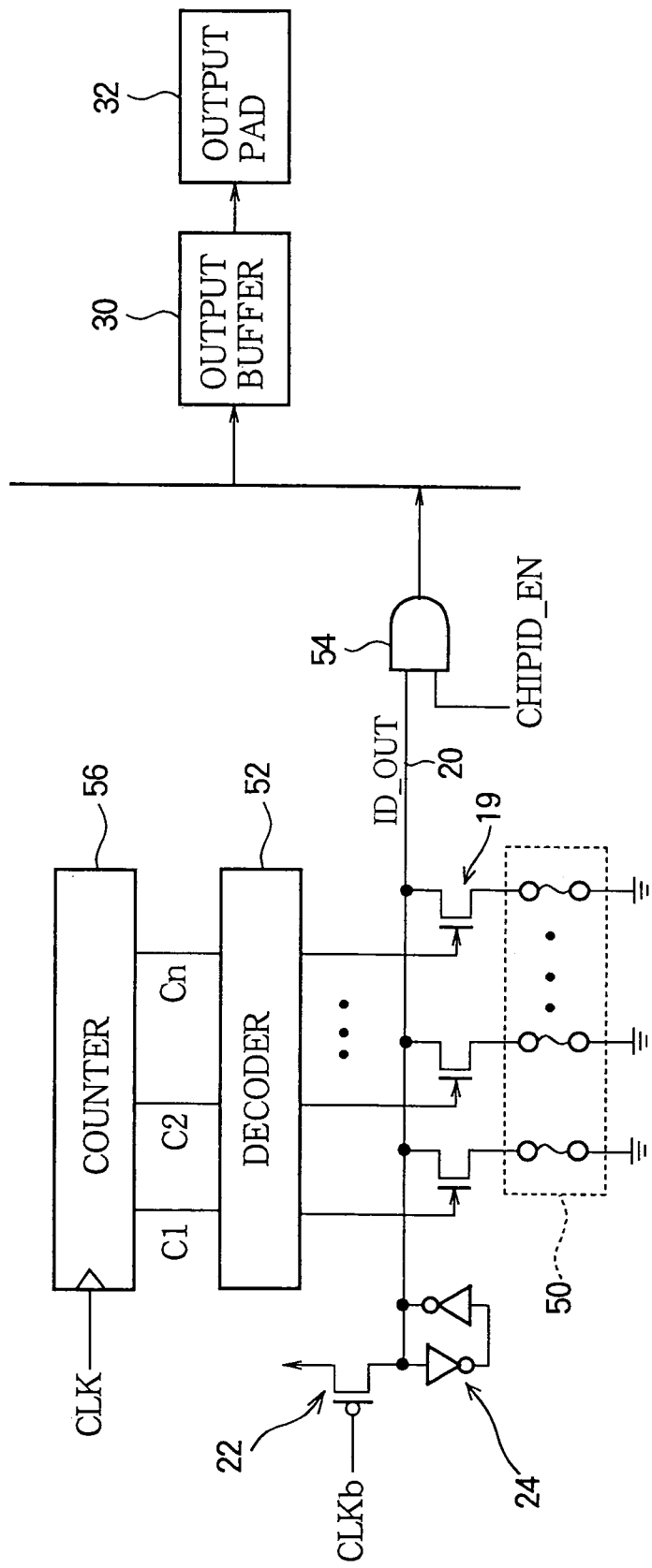
FIG. 5 is a block diagram of a conventional circuit for storage and output of identifying information in a semiconductor memory device.

For comparison, FIG. 4 shows a conventional semiconductor memory device in which redundancy repair information is programmed into the fuses in a first fuse box 46 and roll call results are output to the data bus 28 through a two-input AND gate 48 that receives the Y redundancy signal (YRED) from the redundancy decision circuit 16 and receives the roll call enable signal (ROLLCALLY). FIG. 5 shows a conventional circuit that can be added to the circuit in FIG. 4 to output identifying information. The identifying information is stored in a second fuse box 50 which is connected through NMOS transistors 19 to an ID_OUT signal line 20. As in the above embodiments of the present invention, the NMOS transistors 19 are switched on and off by the outputs of a decoder 52, one end of the ID_OUT signal line 20 is connected to the drain of a PMOS transistor 22 that has its source connected to the power supply, and the logic level on the ID_OUT signal line 20 is latched in a latch 24. Differing from the embodiments above, the other end of the ID_OUT signal line 20 is connected to an AND gate 54 that also receives the chip-ID enable signal CHIPID_EN, and outputs the chip-ID signal to the data bus 28 when CHIPID_EN is active (high). Furthermore, the decoder 52 decodes a count signal (C1, C2, . . . , Cn) output from a counter 56, instead of decoding the Y address signal. The counter 56 counts cycles of a clock signal CLK. The gate of the PMOS transistor receives a complementary clock signal CLKb inverse to the clock signal CLK.

To obtain the identifying information stored in the second fuse box 50, test equipment activates the chip-ID enable signal and supplies the necessary number of clock pulses to the counter 54 and the gate of PMOS transistor 22.

The circuit in FIG. 5 can be designed to output an arbitrary number of bits of identifying information by using a counter 56 that outputs a suitable number (n) of bits. For example, a four-bit counter (n=4) can provide sixteen ($2^4$) bits of identifying information, corresponding to count values from zero (binary '0000') to fifteen (binary '1111'). In contrast, the number of bits of identifying information in the present invention is limited by the number of possible values of the Y address signal. In typical semiconductor memory devices, however, the number of Y address bits is eight or more, allowing two hundred fifty-six ($2^8$) or more bits of identifying information, which is more than enough to uniquely identify every memory chip that could ever be manufactured from the earth's resources. Accordingly, the number of bits of identifying information poses no real problem in the present invention.

The present invention is not limited to the embodiments described above. For example, the memory cell array 2 may include multiple redundant columns 6, and the redundancy decision circuit 16 may output a multiple-bit Y redundancy signal to select a specific one of the redundant columns to replace each of multiple defective columns in the regular row-column array 4. The necessary modification to the logic circuit in FIG. 3, in this case, is to use a NAND gate 40 having more than two inputs, and provide a separate inverter 38 for each bit of the Y redundancy signal. Alternatively, the logic circuit can be modified to provide multiple-bit out put indicating which redundant column has been selected to replace each defective column.

The invention can be practiced with respect to row redundancy instead of column redundancy, using the row address signal instead of the column address signal.

Those skilled in the art will recognize that further variations are possible within the scope of the invention, which is defined in the appended claims.

What is claimed is:

1. A semiconductor memory device having an array of memory cells including redundant memory cells for replacing defective memory cells, and a data bus for output of information read from the memory cells responsive to input of an address signal selecting the memory cells, the memory device comprising:
- an information storing circuit storing first information indicating which memory cells have been replaced by redundant memory cells and second information identifying the semiconductor memory device;
- a decision circuit receiving the address signal, comparing the received address signal with the first information stored in the information storing circuit, and outputting a result signal to the data bus; and
- an identifying circuit receiving the address signal, reading the second information from the information storing circuit according to the address signal, and outputting the information thus read to the data bus.

2. The semiconductor memory device of claim 1, wherein the identifying circuit outputs the second information one bit at a time as the address signal changes from one value to another.

3. The semiconductor memory device of claim 1, wherein the information storing circuit comprises:
- a first plurality of fuses programmable to store the first information; and
- a second plurality of fuses programmable to store the second information.

4. The semiconductor memory device of claim 3, wherein the information storing circuit comprises a single fuse box in which both the first plurality of fuses and the second plurality of fuses are disposed.

5. The semiconductor memory device of claim 1, further comprising:
- an output pad; and
- an output buffer connected to the data bus, outputting both the result signal and the second information at the output pad.

6. The semiconductor memory device of claim 1, further comprising a logic circuit having a first input terminal for receiving the result signal from the decision circuit, a second input terminal for receiving the second information read by the identifying circuit, and an output terminal for supplying both the result signal and the second information to the data bus.

7. The semiconductor memory device of claim 1, wherein the decision circuit also receives an enable signal, and outputs the result signal to the data bus only when the enable signal is active.

8. The semiconductor memory device of claim 1, wherein the identifying circuit receives an enable signal, and outputs the second information to the data bus only when the enable signal is active.

9. The semiconductor memory device of claim 1, further comprising a three-state logic circuit having:
- a first input terminal receiving a first enable signal having an active state and an inactive state;
- a second input terminal receiving a second enable signal having an active state and an inactive state;
- a third input terminal receiving the result signal from the decision circuit;
- a fourth input terminal receiving the second information read by the identifying circuit;
- logic circuitry for performing a first logic operation on the first enable signal and the second enable signal and a second logic operation on the result signal and the second information; and
- an output terminal for supplying a result of the second logic operation to the data bus, conditional on a result of the first logic operation, the output terminal being placed in a high-impedance state when the first enable signal and the second enable signal are both inactive; wherein
- the decision circuit also receives the second enable signal, and outputs the result signal only when the second enable signal is inactive; and
- the identifying circuit also receives the second enable signal, and outputs the second information only when the second enable signal is active.

10. The semiconductor memory circuit of claim 1, wherein the address signal is a column address signal.

11. The semiconductor memory circuit of claim 1, wherein the address signal is a row address signal.

12. A semiconductor memory device comprising:
- an array of memory cells which includes redundant memory cells, the array being coupled to a data bus;
- an information storing circuit that stores both first information indicating which of the memory cells have been replaced by the redundant memory cells and second information identifying the semiconductor memory device;
- a decision circuit, coupled to the information storing circuit, that receives an address signal, compares the address signal with the first information, and outputs a result signal to the array to select the redundant memory cells when the address signal and the first information coincide; and
- an identifying circuit, coupled to the information storing circuit, that receives the address signal, reads the second information responsive to the address signal, and outputs the read second information to the data bus.

13. The semiconductor memory device of claim 12, wherein the decision circuit receives a first enable signal and outputs the result signal only when the first enable signal is active, and wherein the identifying circuit receives a second enable signal and outputs the read second information only when the second enable signal is active.

14. The semiconductor memory device of claim 13, further comprising a logical circuit, coupled to the decision circuit and the identifying circuit, that receives the first and second enable signals, performs a logical NOR operation on the first and second enable signals, performs a logical AND operation on the result signal and the read second information, enters a high impedance state when a result of a logical NOR operation is logically high, and provides a result of the logical AND operation to the data bus as output information when the result of the logical NOR operation is logically low.

15. The semiconductor memory device of claim 12, further comprising a logical circuit, coupled to the decision circuit and the identifying circuit, that performs a logical AND operation on the result signal and the read second information, and provides a result of the logical AND operation to the data bus as output information.

* * * * *